United States Patent
Yip

(10) Patent No.: US 10,902,927 B2
(45) Date of Patent: *Jan. 26, 2021

(54) REDUCING PROGRAMMING DISTURBANCE IN MEMORY DEVICES

(71) Applicant: Micron Technology, Inc., Boise, ID (US)

(72) Inventor: Aaron Yip, Los Gatos, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/784,899

(22) Filed: Feb. 7, 2020

(65) Prior Publication Data

US 2020/0321064 A1 Oct. 8, 2020

Related U.S. Application Data

(63) Continuation of application No. 15/451,022, filed on Mar. 6, 2017, now Pat. No. 10,559,367, which is a (Continued)

(51) Int. Cl.
*G11C 16/04* (2006.01)
*G11C 16/34* (2006.01)
(Continued)

(52) U.S. Cl.
CPC ...... *G11C 16/3427* (2013.01); *G11C 16/0483* (2013.01); *G11C 16/10* (2013.01); *G11C 16/24* (2013.01)

(58) Field of Classification Search
CPC . G11C 16/3427; G11C 16/24; G11C 16/0483; G11C 16/10
(Continued)

(56) References Cited

U.S. PATENT DOCUMENTS 5,511,022 A 4/1996 Tim et al.
6,639,842 B1 10/2003 Hoang et al.
(Continued)

FOREIGN PATENT DOCUMENTS

TW 201428752 A 7/2014
WO WO-2014058781 A1 4/2014

OTHER PUBLICATIONS

"International Application Serial No. PCT/US2013/063688, International Preliminary Report on Patentability dated Apr. 16, 2015", 8 pgs.
(Continued)

*Primary Examiner* — Tha-O H Bui
(74) *Attorney, Agent, or Firm* — Schwegman Lundberg & Woessner, P.A.

(57) ABSTRACT

Apparatus and methods are provided, such as a method that includes precharging channel material of a string of memory cells in an unselected sub-block of a block of memory cells to a precharge voltage during a first portion of a programming operation. A programming voltage can then be applied to a selected memory cell in a selected sub-block of the block of memory cells during a second portion of the programming operation. The selected memory cell is coupled to a same access line as an unselected memory cell in the unselected sub-block. Additional methods and apparatus are provided.

24 Claims, 6 Drawing Sheets

Related U.S. Application Data continuation of application No. 13/647,179, filed on Oct. 8, 2012, now Pat. No. 9,589,644.

(51) Int. Cl.
  *G11C 16/10* (2006.01)
  *G11C 16/24* (2006.01)

(58) Field of Classification Search
  USPC .................................................. 365/185.02
  See application file for complete search history.

(56) References Cited

U.S. PATENT DOCUMENTS

| | | | |
|---|---|---|---|
| 6,804,150 B2 | 10/2004 | Park et al. | |
| 6,944,068 B2 | 9/2005 | Quader et al. | |
| 7,196,930 B2 | 3/2007 | Han et al. | |
| 8,427,881 B2* | 4/2013 | Jang | G11C 16/24 365/185.25 |
| 9,589,644 B2 | 3/2017 | Yip | |
| 10,559,367 B2 | 2/2020 | Yip | |
| 2003/0002338 A1 | 1/2003 | Xu et al. | |
| 2005/0128807 A1* | 6/2005 | Chen | G11C 16/3427 365/185.17 |
| 2005/0232012 A1* | 10/2005 | Park | G11C 16/0483 365/185.17 |
| 2006/0256622 A1 | 11/2006 | Aritome | |
| 2009/0129170 A1 | 5/2009 | Lee | |
| 2011/0019486 A1 | 1/2011 | Jang et al. | |
| 2011/0090739 A1* | 4/2011 | Goda | G11C 16/10 365/185.18 |
| 2012/0039130 A1 | 2/2012 | Yoon et al. | |
| 2014/0098606 A1 | 4/2014 | Yip | |
| 2017/0178738 A1 | 6/2017 | Yip | |

OTHER PUBLICATIONS

"International Application Serial No. PCT/US2013/063688, International Search Report dated Jan. 22, 2014", 3 pgs.

"International Application Serial No. PCT/US2013/063688, Written Opinion dated Jan. 22, 2014", 6 pgs.

"Taiwanese Application Serial No. 102136411, Office Action dated May 12, 2017", w/Translation, 23 pgs.

"Taiwanese Application Serial No. 102136411, Response filed Aug. 11, 2017 to Office Action dated May 12, 2017", 27 pgs.

\* cited by examiner

REDUCING PROGRAMMING DISTURBANCE IN MEMORY DEVICES

PRIORITY APPLICATION

This application is a continuation of U.S. application Ser. No. 15/451,022, filed Mar. 6, 2017, which is a continuation of U.S. application Ser. No. 13/647,179, filed Oct. 8, 2012, now issued as U.S. Pat. No. 9,589,644, all of which are incorporated herein by reference in their entireties.

BACKGROUND

Memory applications often incorporate high density non-volatile memory devices where retention of memory contents is desired when no power is supplied to the memory device. For example, NAND memory, such as 3D flash NAND memory, offers storage in the form of compact, high density configurations. The compact nature of the 3D flash NAND structure means word lines are common to many memory cells within a block of memory.

During a programming operation a selected memory cell(s) may be programmed with the application of a programming voltage to a selected word line. Due to the word line being common to multiple memory cells, unselected memory cells may be subject to the same programming voltage as the selected memory cell(s). If not otherwise preconditioned, the unselected memory cells may experience effects from the programming voltage on the common word line. These programming effects compromise the condition of charge stored in the unselected memory cells which are expected to maintain stored data. This programming voltage effect is termed a "programming disturbance" or "programming disturb" effect by those of ordinary skill in the art.

BRIEF DESCRIPTION OF DRAWINGS

Some embodiments are illustrated by way of example and not limitation in the figures of the accompanying drawings in which.

DETAILED DESCRIPTION

Figure 1:
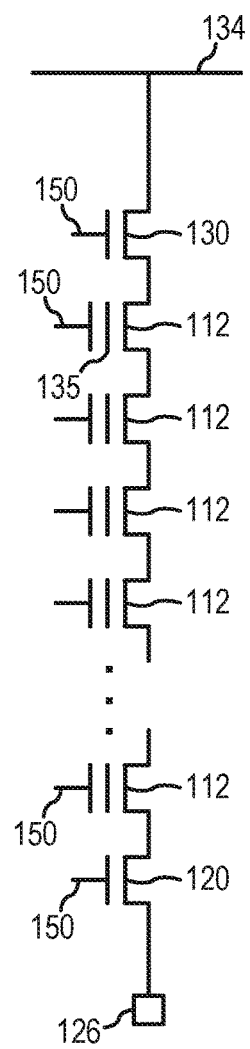
FIG. 1 is an electrical schematic diagram of an apparatus in the form of a string of memory cells, according to an example embodiment.

In the following description, for purposes of explanation, numerous specific details are set forth in order to provide a thorough understanding of some example embodiments. It will be evident, however, to one of ordinary skill in the art that various embodiments of the invention may be practiced without these specific details.

NAND memory, such as 3D flash NAND, offers electronically programmed memory in compact high density configurations that are non-volatile. These nonvolatile memories can be reprogrammed, read, and erased electronically. To achieve high density, a string of memory cells in a 3D NAND device may be constructed to include 32 or more memory cells at least partially surrounding a pillar of channel material. The memory cells may be coupled to access lines, which are commonly referred to in the art and this application as "word lines", often fabricated in common with the memory cells, so as to form an array of strings in a block of memory according to some embodiments.

In this type of 3D NAND structure, word lines are common to many memory cells during a programming operation intended to be performed on a selected memory cell(s) at the time. The unselected memory cells coupled to the same word line as the selected memory cell(s) experience the same programming voltage as the selected cell(s). The programming voltage on the common word line may produce programming disturb effects in unselected memory cells that render the charge stored in the unselected memory cells unreadable altogether or, although still apparently readable, the contents of the memory cell may be read as a data value different than the intended data value stored before application of the programming voltage.

The program disturb effect is often experienced when the channel material of unselected memory cells are at a voltage sufficiently different than the programming voltage. This difference in voltage may initiate an electrostatic field of sufficient magnitude to change the charge on a corresponding charge storage structure and cause the contents of the memory cell to be read incorrectly. The program disturb effect can be even more pronounced when the channel material of the unselected cells are left in an arbitrary or an initial state and not otherwise preconditioned to be resistant to the programming voltage.

Due to the variations in fabrication across the extent of a memory device, certain cells may require a programming voltage higher than the nominal magnitude for the device. This increase in the required programming voltage may be about 2-3 Volts (V) above the nominal programming voltage in some cases. This additional magnitude of voltage, although required for programming particular memory cells, can also be sufficient to trigger undesirable programming (program disturb) in unselected memory cells.

According to some embodiments described herein, an additional voltage may be applied to the channel material of the strings of memory cells in a block of memory during a precharge portion of a programming operation. The additional precharge voltage may be on the order of 2-3V according to certain example embodiments. The precharge voltage may be sufficient to allow general use of a higher programming voltage that is required to overcome hard to program memory cells. These increased programming voltages, when used with the included methods, may be used to program stubborn memory cells, while significantly reducing the incidence of the program disturb effect that the elevated programming voltages might otherwise bring about.

FIG. 1 is an electrical schematic diagram of an apparatus in the form of a string 100 of memory cells, according to an example embodiment. The string 100 includes memory cells 112 (i.e., charge storage devices); up to 32 cells 112 (or more) in some embodiments. The string 100 includes a source-side select transistor known as a source select gate 120 (SGS) (typically an n-channel transistor) coupled between a memory cell 112 at one end of the string 100 and a common source 126.

The common source 126 may comprise, for example, a commonly doped semiconductor material and/or other conductive material. At the other end of the string 100, a drain-side select transistor called a drain select gate 130 (SGD) (typically an n-channel transistor) is coupled between one of the memory cells 112 and a data line 134, which is commonly referred to in the art as a "bit line". The common source 126 can be coupled to a reference voltage (e.g., ground voltage or simply "ground" [Gnd]) or a voltage source (e.g., a charge pump circuit or power supply which may be selectively configured to a particular voltage suitable for optimizing a programming operation, for example).

Each memory cell 112 may include, for example, a floating gate transistor or a charge trap transistor and may comprise a single level memory cell or a multilevel memory cell. The floating gate may be referred to as a charge storage structure 135. The memory cells 112, the source select gate 120, and the drain select gate 130 may be controlled by signals on their respective control gates 150.

Figure 2:
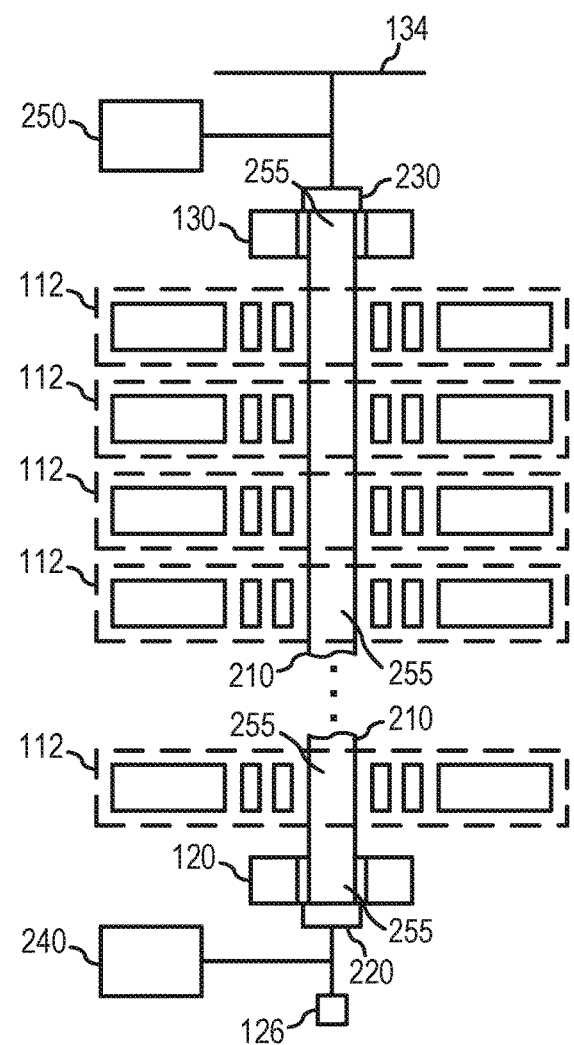
FIG. 2 is a cross-sectional view of a semiconductor construction of the string shown in FIG. 1, according to an example embodiment.

The control signals may be applied to select lines (not shown) to select strings, or to access lines (not shown) to select memory cells 112, for example. In some cases, the control gates can form a portion of the select lines (for select devices) or access lines (for cells). The drain select gate 130 receives a voltage that can cause the drain select gate 130 to select or deselect the string 100. The string 100 can be one of multiple strings of memory cells in a block of memory cells in a NAND memory device, FIG. 2 is a cross-sectional view of a semiconductor construction 200 of the string 100 (FIG. 1), according to an example embodiment. The memory cells 112, the source select gate 120 and the drain select gate 130 at least partially surround (e.g., surround or partially surround) a pillar 210 of semiconductor material. The pillar 210 can comprise p type polysilicon and is a channel material 255 for the memory cells 112, the source select gate 120, and the drain select gate 130. The memory cells 112, the source select gate 120, and the drain select gate 130 are associated with the channel material 255. The channel material 255 can extend between a source cap 220 comprising n+ type polysilicon and a drain cap 230 comprising n+ type polysilicon.

The source cap 220 is in electrical contact with the channel material 255 and forms a p-n junction with the channel material 255. The drain cap 230 is in electrical contact with the channel material 255 and forms a p-n junction with the channel material 255. The source cap 220 is a source for the channel material 255 and the drain cap 230 is a drain for the channel material 255. The source cap 220 is coupled to the common source 126 and may be coupled to a first supply 240. The drain cap 230 is coupled to the data line 134 and may be coupled to a second supply 250. A supply, such as the first supply 240 or the second supply 250 may be implemented as a charge pump circuit, a power supply, or a voltage source, among others.

Figure 3:
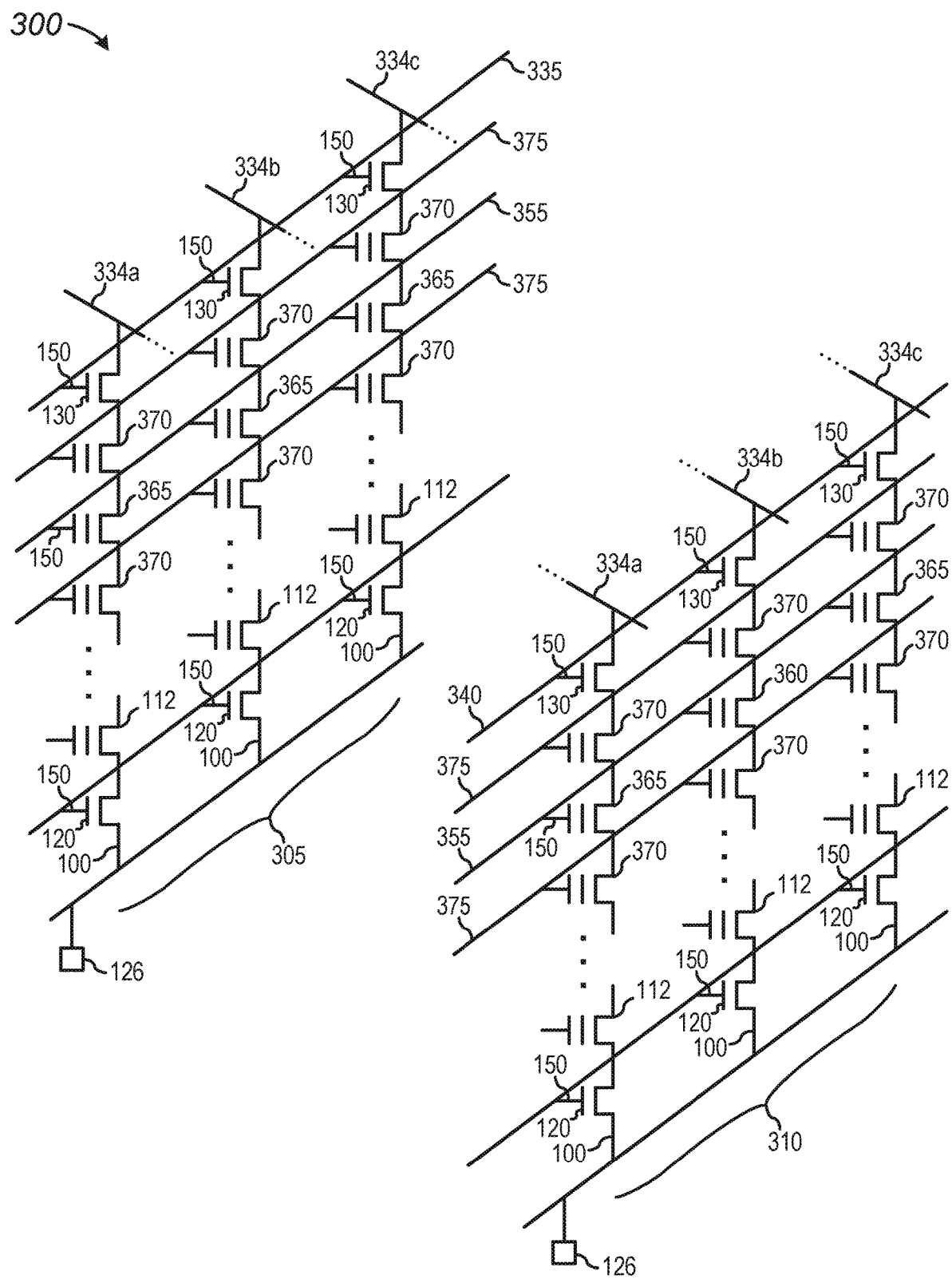
FIG. 3 is an electrical schematic diagram of an apparatus in the form of a block of memory cells, according to an example embodiment.

FIG. 3 is an electrical schematic diagram of an apparatus in the form of a block 300 of memory cells, according to an example embodiment. The block 300 may include a first sub-block 305 and a second sub-block 310 of memory cells. Each of the sub-blocks 305, 310 may include strings 100 of memory cells extending in a number of, for example, many tens or hundreds (or more) according to memory organizations in some example embodiments. The ends of the strings 100, including the source select gates 120, are coupled to the common source 126. The ends of the strings 100, including drain select gates 130, are coupled respectively to data lines 334a, 334b, 334c. The number of data lines in an example embodiment may extend in number to couple to each row of strings 100 included in the associated organization of memory. The data lines 334a, 334b, 334c and additional data lines that may be included in a particular example embodiment may extend to other blocks of memory cells and be coupled to further strings in a similar fashion to that shown in block 300. The drain select gates 130 of the strings 100 of the first sub-block 305 are commonly coupled to a first select line 335. In a similar fashion, the drain select gates 130 of the strings 100 of the second sub-block 310 are commonly coupled to a second select line 340.

In the block 300, the memory cells in a particular level of the block are commonly coupled to a respective access line, regardless of which sub-block they are in. For example, the memory cells 370 in a first level of the block 300 are commonly coupled to a first access line 375. Likewise, the memory cells 360, 365 in a second level of the block 300 are commonly coupled to a second access line 355. In example embodiments where more sub-blocks may be included in the block 300, the second level of memory cells 365 in the additional sub-blocks would also be commonly coupled to the access line 355. For clarity, not all access lines in the block 300 are shown.

During a programming operation on a selected memory cell 360 in a selected sub-block (e.g., second sub-block 310), all memory cells 365 at the same level within the respective strings 100 as the selected memory cell 360 are coupled to the same respective access line 355 and receive the same programming voltage on the respective common access line 355. Similarly, for levels that do not include a memory cell 360 selected for programming, all memory cells 370 at the same level within their respective strings would receive the same voltage (e.g., a program pass voltage) on their respective common access line 375.

The presence of the programming voltage on the selected access line 355 can cause a voltage difference between a control gate 150 and the channel material 255 of the unselected memory cells 365 in the unselected sub-blocks (e.g., the first sub-block 305) in proportion to the amount of capacitive coupling between the selected access line 355 and the channel material. The potential of a program disturb effect due to this voltage difference can be reduced by precharging the channel material 255 of the memory cells 365 of the unselected sub-blocks (e.g., first sub-block 305) prior to applying the programming voltage.

Figure 4:
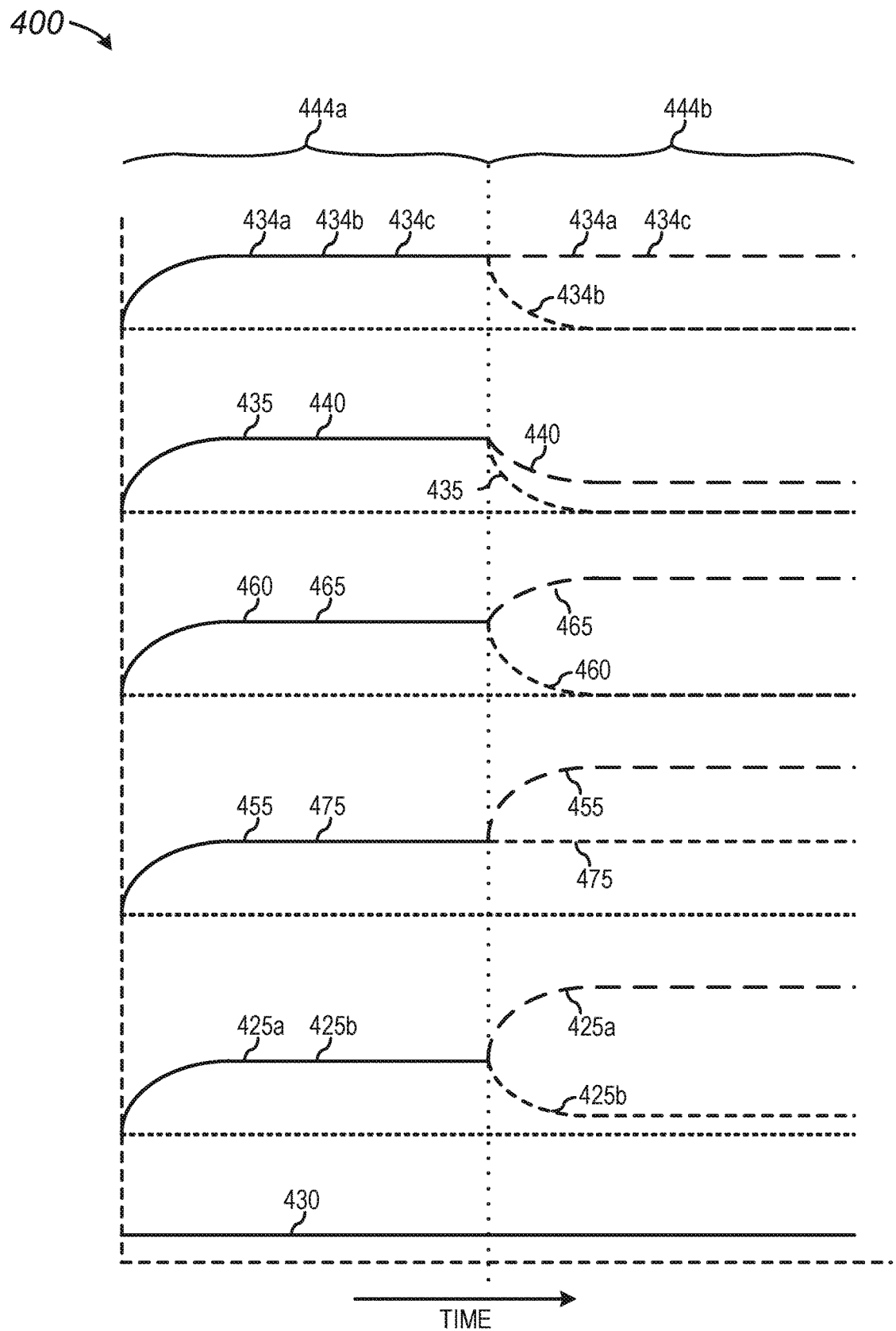
FIG. 4 is a timing diagram for the block of FIG. 3 during a programming operation, according to an example embodiment.

FIG. 4 is a timing diagram 400 for the block of FIG. 3 during a programming operation, according to an example embodiment. During an initial (e.g., precharge) portion of the programming operation 444a, the channel material 255 of all strings of a selected block of memory cells are pre-charged to approximately a supply voltage (VCC) of the memory device. By pre-charging the channel material 255 of all strings in the selected block, a substantially uniform enhancement of the resistance to program disturb may be accomplished for all unselected strings of the block.

During a subsequent portion of the programming operation 444b, the channel material 255 of a selected string (e.g., the string including selected memory cell 360) is coupled to a voltage configured to allow programming of a selected memory cell 360 of the string. Also during this subsequent portion of the programming operation 444b, the channel material 255 of the strings of the unselected sub-blocks of the block are allowed to float (e.g., by grounding the select lines coupled to their SGDs).

While the channel material 255 of the strings of the unselected sub-block(s) of memory cells are allowed to float (i.e., after being precharged), a programming voltage is applied to the selected access line 355. As the channel material 255 of the selected string is at a voltage configured to allow programming, application of the programming voltage to the selected memory cell 360 creates a voltage difference between the control gate of the selected memory cell 360 and its channel material 255 sufficient to program the selected memory cell 360. However, as the channel material 255 of the strings of the unselected sub-blocks of memory cells are floating at approximately VCC, the likelihood of a voltage difference between the control gates of the unselected memory cells 365 and their channel material being high enough to cause program disturb should be reduced.

Referring now to FIGS. 3 and 4, it can be seen that in the upper portion of the timing diagram 400 are shown data line voltages 434a-434c that correspond to voltages on the data lines 334a-334c. In an initial portion of the programming operation 444a, the data line voltages 434a-434c can be driven to a voltage approximately equal to the supply voltage VCC, which can be equal to approximately 2V-3.3V according to certain example embodiments. The data line voltages 434a-434c may also be driven to a further precharge voltage provided by a power supply or some other source, such as a voltage that may be produced by first supply 240 or the second supply 250, according to a further example embodiment. The further precharge voltage may be configured to provide an optimal precharge voltage condition on the channel material 255 different from the readily available supply voltage VCC. The further precharge voltage may be greater than approximately 3.3V but should not exceed a voltage that may damage the associated device (e.g., a gate oxide breakdown voltage).

Beneath the data line voltages 434a-434c in the timing diagram 400, are shown a first SOD voltage 435 on the select line 335 of an unselected sub-block 305 and a second SOD voltage 440 on the select line 340 of a selected sub-block 310. In the initial portion of the programming operation 444a, the first SOD voltage 435 and the second SOD voltage 440 are brought high, to approximately 4V according to an example embodiment, to enable the drain select gates 130 of the first sub-block 305 and the second sub-block 310 to couple the data line voltages 434a-434c to the channel material 255 of all strings 100 in the block 300. In this way, a precharge voltage (e.g., approximately VCC) is applied to the channel material 255 of both the selected memory cell(s) 360 and the unselected memory cells 365. The voltages 460, 465 on the channel material 255 of the selected memory cell(s) 360 and the unselected memory cells 365, respectively, are shown beneath the SOD voltages. The voltages 460, 465 may be approximately 2V-3.3V (approximately equal to VCC) in the initial portion of the programming operation 444a.

Beneath the voltages 460, 465 are shown as voltages 455, 475 on a selected access line 355 and an unselected access line 375, respectively. During the initial portion of the programming operation 444a both the selected access line voltage 455 and the unselected access line voltage 475 are driven to a pass voltage (e.g., about 10V according to an example embodiment), to provide a conducting condition in device channels (not shown) of the memory cells. The conducting condition helps assure that no portions of the channel material 255 are isolated from a precharge voltage applied to the channel material 255 in the initial portion of the programming operation 444a that would otherwise degrade a precharge voltage and therefore reduce the resistance to programming disturb effects on the associated channel material 255.

Beneath the access line voltages on the timing diagram 400 are shown tunnel oxide voltages 425a, 425b corresponding to a voltage across tunnel oxides in the selected memory cell(s) 360 and the unselected memory cells 365 respectively. During an initial portion of a programming operation, the tunnel oxide voltages 425a, 425b may be approximately 6.5-8V according to an example embodiment. During this portion of the programming operation both tunnel oxide voltages may be approximately equal to the difference between the respective access line voltage and the channel material precharge voltage.

During the initial portion of the programming operation 444a a voltage 430 on the select line(s) coupled to the source select gates 120 is maintained at approximately 0V to help keep the channel material 255 of the memory cells isolated from the common source 126.

Turning to the subsequent portion of the programming operation 444b, the voltages 434a, 434c on data lines 334a, 334c coupled to strings that do not include a memory cell 360 selected for programming are at a program inhibit level. For example, in embodiments where a precharge voltage level is equivalent to a program inhibit voltage level, voltages 434a and 434c can be maintained at the same voltage level as in the initial portion of the programming operation 444a (e.g., approximately equal to a supply voltage VCC). In contrast, the voltage 434b on data lines 334b coupled to strings that include a memory cell 360 selected for programming can be lowered to a program enable voltage level. For example data line voltage 434 b can be reduced to approximately GND (e.g., 0V) by coupling the data line 334b to the GND of the memory device, for example.

During the subsequent portion of the programming operation 444b, the voltage 435 on a select line 335 of an unselected sub-block 305 is driven to approximately 0V, such as to ensure that the drain select gates 130 of the unselected sub-block 305 do not conduct. Accordingly, the channel material 255 of the strings of the unselected sub-block 305 is allowed to float while retaining the precharge voltage (e.g., approximately equal to VCC) applied in the initial portion of the programming operation 444a.

Subsequently, responsive to application of a programming voltage on a selected access line 365, the channel material voltage 465 of the strings of the unselected sub-block is shown to rise from the precharge voltage (approximately VCC) according to a coupled voltage induced on the associated channel material 255 by the programming voltage on the selected access line 355. The addition of the induced coupled voltage to the precharge voltage on the nonprogrammed channel material 255 is due to the rise in the selected access line voltage 455 to approximately 20V during this portion of the programming operation.

During the subsequent portion of the programming operation 444b, the voltage 440 on a select line 340 of a selected sub-block 310 is driven to approximately 1V so that the drain select gates 130 of the selected sub-block 310 conduct with an on-channel resistance sufficiently low to allow the program enable data line voltage 434b (e.g., 0V) to be provided on the corresponding channel material 255 associated with the selected memory cell 360. Correspondingly, the voltage 460 on the channel material of the selected memory cell(s) is shown to attain approximately the 0V level provided by the data line voltage 434b during this portion of the programming operation according to the example embodiment as described above.

During the subsequent portion of the programming operation 444b, the selected access line 355 provides the programming voltage of approximately 20V to the selected memory cell 360. Accordingly, the selected access line voltage 455 is shown to rise to the 20V level of the programming voltage during the subsequent portion of the programming operation. The programming voltage (i.e., the selected access line voltage 455) applied to the control gate of the selected memory cell 360 is sufficient to generate a programming electrostatic potential in approximate proportion to a difference in voltage between the programming voltage applied to the access line and the program enabled channel material voltage 460. Thus, the tunnel oxide voltage 425a of the selected memory cell 360 will attain a voltage approaching the 20V programming voltage but may actually be determined by the charge induced on the corresponding charge storage structure 135 and the data value being stored (i.e., a "1" or a "0").

During the subsequent portion of the programming operation 444b, the tunnel oxide voltage 425b of the unselected memory cells 365 may be less than approximately 1V-2V, depending on the magnitude of the coupled voltage, leakage currents, and device thresholds of the drain select gates 130 involved in coupling the precharge voltage to the channel material 255. The voltages 475 applied to the unselected access lines 375 can remain at the 10V level provided in the initial portion of the programming operation 444a. In this way, the conducting condition in device channels (not shown) of the memory cells 112 is perpetuated during the subsequent portion of the program operation.

During the subsequent portion of the programming operation 444b the voltage 430 on the select line(s) coupled to the the source select gates is maintained at a value of approximately 0V to continue isolation of the channel material 255 of the memory cells from the common source 126.

Figure 5:
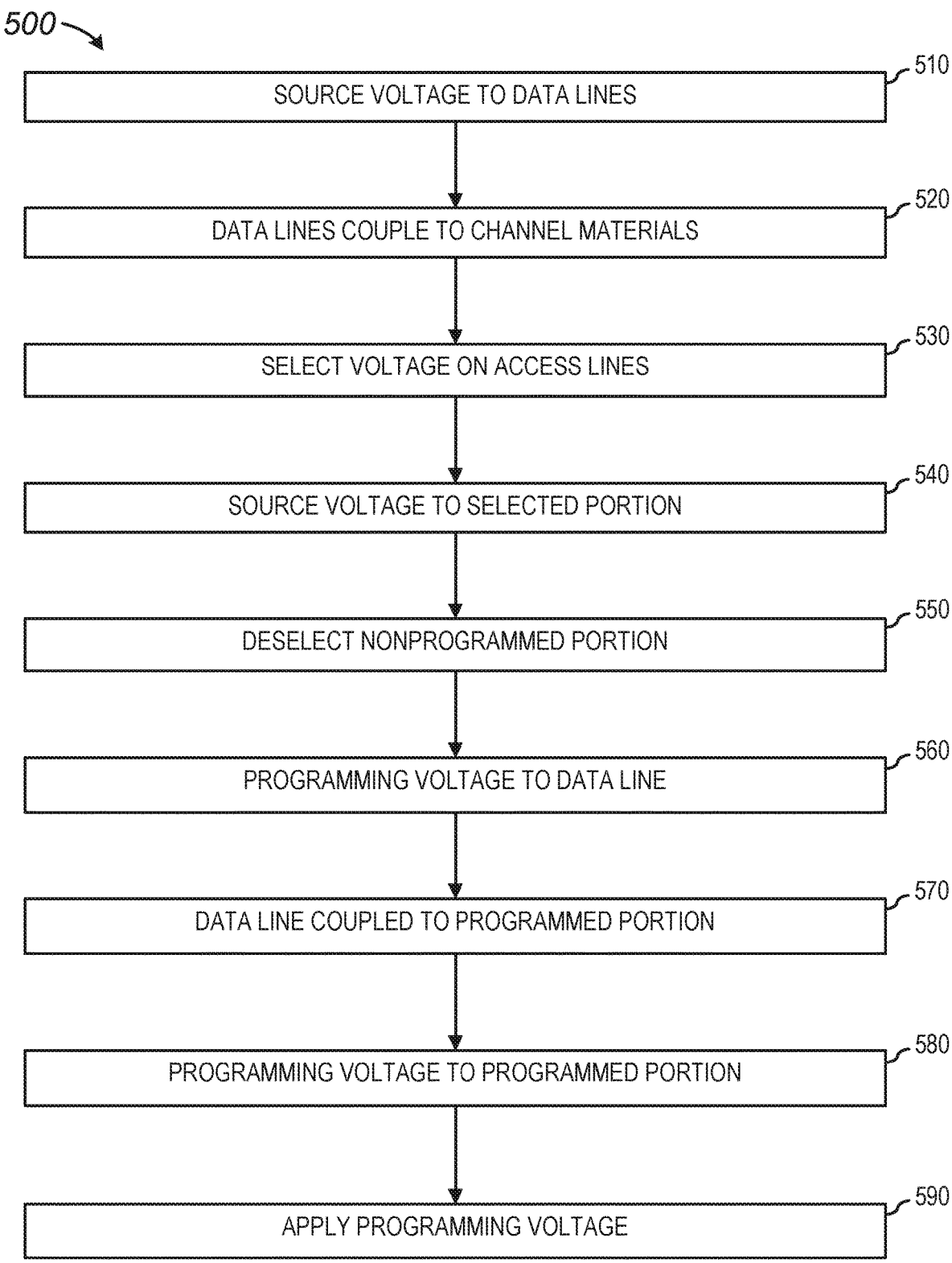
FIG. 5 is a flow chart illustrating a method to reduce programming disturb effects in a memory, according to an example embodiment.

FIG. 5 is a flow chart illustrating a method of reducing programming disturb effects 500, according to an example embodiment. Referring now to FIGS. 1-5, it can be seen that the method commences with a precharge voltage being applied 510 to the data lines 334a, 334b, 334c of a block of memory cells. The method continues with applying 520 voltages to the select devices 130 of the block of memory cells to couple the data lines 334a, 334b, 334c to associated channel material 255 of strings coupled to the data lines. For example, as shown in FIG. 4, the drain select gates of the block can be coupled to one of the SGD voltages 435,440 in the initial portion of the programming operation 444a. The method continues with applying 530 pass voltages to the access lines of the block. For example, the access lines can be coupled to one of the access line voltages 455,475 in the initial portion of the programming operation 444a. Accordingly, the channel material of the strings of the block are precharged to the precharge voltage applied to the data lines.

The method continues with decoupling 550 unselected sub-blocks of memory cells. For example, a SGD voltage 435 applied to the select lines of the unselected sub-blocks can be driven to approximately 0V. In this condition, the drain select gates 130 of the unselected sub-blocks 305 do not conduct and thus allow the associated channel material 255 of the unselected sub-blocks to float while retaining the precharge voltage (approximately equal to VCC) provided in the initial portion of the programming operation 444a. The method continues on by applying 560 a program enable voltage (e.g., 0 V) to a selected data line 334b coupled to a selected string of memory cells (e.g., a string that includes the selected memory cell 360).

The method goes on with the act of applying 570 a voltage to a select device to couple the selected data line to the channel material of the selected string. For example, a SGD voltage 440 applied to a select line 340 of the selected sub-block can be being driven to approximately 1V. Accordingly, the channel material of the selected string (and thus the selected memory cell) is at approximately the program enable voltage applied to the selected data line.

The method concludes with applying 590 the programming voltage to the access line coupled to the selected memory cell 360. For example, the access line voltage 455 applied to the selected memory cell 360 can be driven to a voltage of approximately 20V.

Figure 6:
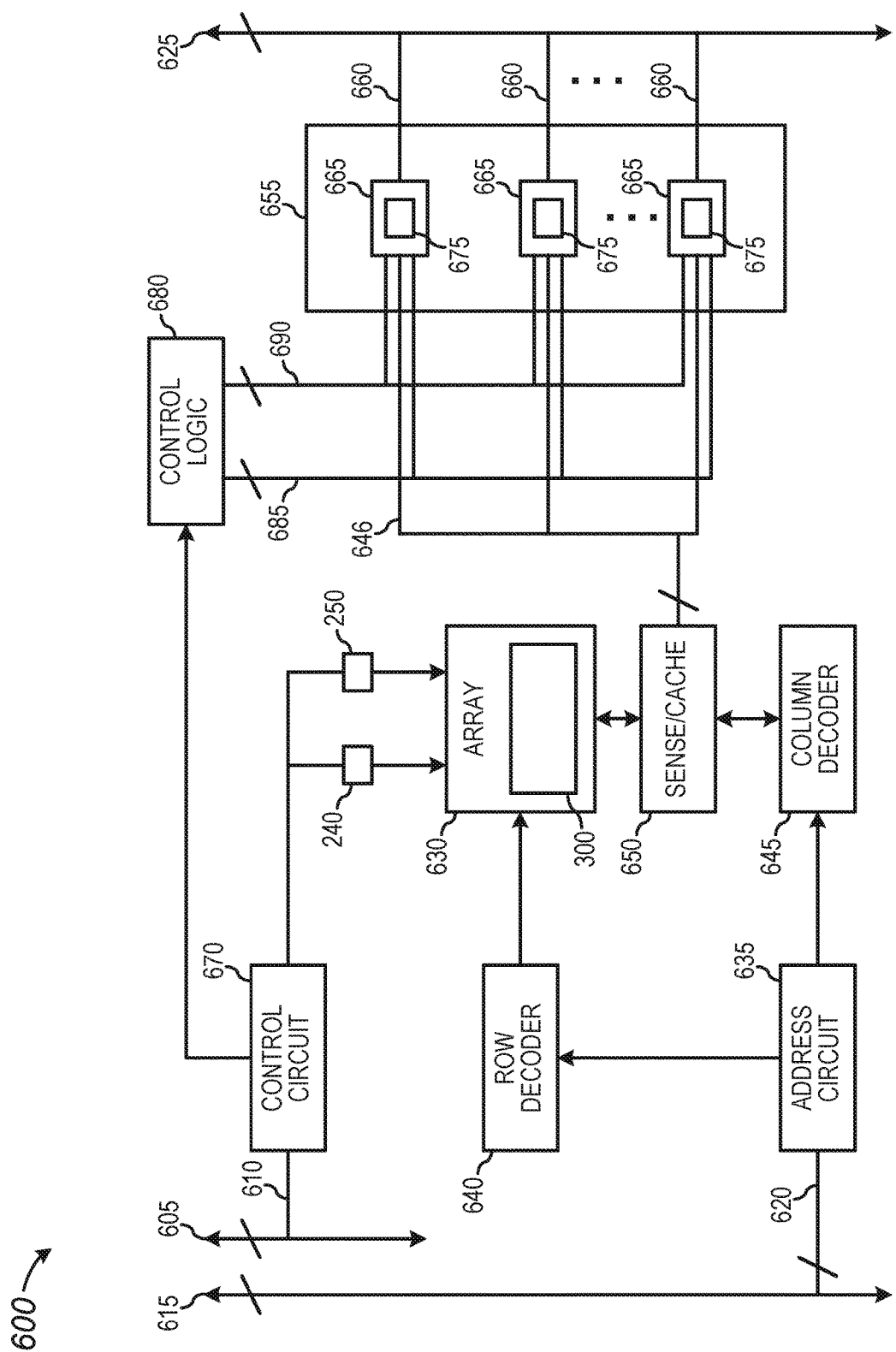
FIG. 6 is a block diagram of an apparatus in the form of a memory device 600, according to an example embodiment.

FIG. 6 is a block diagram of an apparatus in the form of a memory device 600 according to various embodiments of the invention. The memory device 600 is coupled to a control bus 605 to receive multiple control signals over control signal lines 610. The memory device 600 is also coupled to an address bus 615 to receive address signals on address signal lines 620 and is further coupled to a data bus 625 to transmit and receive data signals. Although depicted as being received on separate physical busses, the data signals could also be multiplexed and received on the same physical bus.

The memory device 600 includes one or more arrays 630 of memory cells. The memory cells of the array 630 may comprise non-volatile memory cells (e.g., flash memory cells with floating gate transistors or charge trap transistors) according to various embodiments of the invention. The memory device 600 can be a NAND memory device. The array 630 can include multiple banks and blocks of memory cells residing on a single die or on multiple dice as part of the memory device 600. The memory cells in the array 630 can be single level (SLC) or multilevel (MLC) memory cells, or combinations thereof. The array 630 can include one or more of the blocks 300 of strings 100 of memory cells 112 shown in FIG. 3. The first supply 240 and the second supply 250 can be coupled to the array 630.

An address circuit 635 can latch the address signals received on the address signal lines 620. The address signals can be decoded by a row decoder 640 and a column decoder 645 to access data stored in the array 630. The memory device 600 can read data in the array 630 by sensing voltage or current changes in memory cells in the array 630 using sense devices in a sense/cache circuit 650.

A data input and output (I/O) circuit 655 implements bi-directional data communication over external (e.g., data I/O) nodes 660 coupled to the data bus 625. The I/O circuit 655 can include driver and receiver circuits 665. The memory device 600 includes a controller that is configured to support operations of the memory device 600, such as writing data to and/or erasing data from the array 630. The controller can comprise, for example, control circuitry 670 (e.g., configured to implement a state machine) on a same or different die than that which includes the array 630 and/or any or all of the other components of the memory device 600. The controller can comprise the control circuitry 670, firmware, software or combinations of any or all of the foregoing. Data can be transferred between the sense/cache circuit 650 and the I/O circuit 655 over signal lines 646. The first supply 240 and the second supply 250 can be controlled by the controller. Embodiments of the invention shown in FIGS. 1-5 can be implemented using the controller, such as where the controller is configured to cause one or more of the acts of the disclosed methods to be performed.

Each driver and receiver circuit 665 includes a driver circuit 675. Control signals can be provided to the driver circuits 675 (e.g., through control logic 680 that is coupled to the control circuitry 670). The control logic 680 can provide the control signals over lines 685 and 690 to the driver circuits 675.

Although the invention has been described with reference to specific example embodiments, it will be evident that various modifications and changes may be made to these embodiments without departing from the broader scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more, than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

Plural instances may be provided for components, operations, or structures described herein as a single instance. Finally, boundaries between various components, operations, and data stores may be somewhat arbitrary, and particular operations may be illustrated in the context of specific illustrative configurations. Other allocations of functionality are envisioned and may fall within the scope of the invention(s). In general, structures and functionality presented as separate components in the exemplary configurations may be implemented as a combined structure or component. Similarly, structures and functionality presented as a single component may be implemented as separate components. These and other variations, modifications, additions, and improvements fall within the scope of the invention(s). One or more features from any embodiment may be combined with one or more features of any other embodiment without departing from the scope of the disclosure.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

The Abstract of the Disclosure is provided to comply with rules requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method of operating a memory device, comprising:
    programming a selected memory cell within a memory array of the memory device through a programming operation including first and second portions, the memory array comprising,
        a block comprising multiple strings of memory cells in at least first and second sub-blocks,
        the multiple strings of memory cells extending between a source and an associated data line of multiple data lines, each string including,
        multiple memory cells,
        a source select gate between the multiple memory cells and the source,
        a drain select gate between the memory cells and the associated data line, and channel material;
        multiple access lines coupled to respective memory cells in both of the first and second sub-blocks;
    wherein the memory cell selected for programming is within a selected string of a selected sub-block;
    wherein the first portion of the programming operation comprises pre-charging the channel material of multiple strings of memory cells in both the selected sub-block and the unselected sub-block with a first voltage; and
    wherein the second portion of the programming operation comprises,
        after precharging the channel material of the strings of memory cells in the selected sub-block and the unselected sub-block, applying a programming voltage to a first access line coupled to the selected memory cell in the selected sub-block of the block of memory cells and to at least one unselected memory cell in the unselected sub-block, and
        allowing the channel material of unselected strings in the unselected sub-block to charge to a second voltage greater than the first voltage in response to a coupled voltage induced on the channel material in the unselected sub-block by the programming voltage on the first access line.

2. The method of claim 1, wherein pre-charging the channel material of multiple strings of memory cells in both the selected sub-block in the unselected sub-block comprises enabling respective select gates of the strings of memory cells in the unselected sub-block to couple the precharge voltage to the channel material of the string of memory cells in the unselected sub-block.

3. The method of claim 1, wherein allowing the channel material of unselected strings in the unselected sub-block to charge to the second voltage comprises allowing the channel material of the strings of memory cells in the unselected sub-block to float.

4. The method of claim 3, wherein allowing the channel material of unselected strings of memory cells in the unselected sub-block to float comprises placing a respective select gate of the unselected strings of memory cells in a non-conducting state.

5. The method of claim 4, wherein placing respective select gates of the unselected strings of memory cells in a nonconducting state comprises grounding select lines coupled to the respective select gates of the unselected strings.

6. The method of claim 5, wherein the first SGD voltage and the second SGD voltage are the same.

7. The method of claim 5, wherein the first SGD voltage and the second SGD voltage are each equal to or greater than the first voltage used to precharge the channel material.

8. The method of claim 1, wherein the first portion of the programming operation further comprises applying a first SGD voltage to a second select gate associated with the selected string including the selected memory cell, and applying a second SGD voltage to other second select gates of other memory cell strings in the selected and unselected blocks.

9. The method of claim 1, wherein multiple data lines includes data lines associated with memory cell strings in both of the first and second sub-blocks.

10. The method of claim 1, wherein the first portion of the programming operation comprises applying a third voltage to the selected access line and to multiple unselected access lines to establish a conducting condition in channels of memory cell strings containing memory cells coupled to the access lines.

11. The method of claim 10, wherein the second portion of the programming operation comprises applying a fourth voltage to the multiple unselected access lines.

12. The method of claim 11, wherein the fourth voltage is the same as the third voltage.

13. The method of claim 12, wherein the third and fourth voltages are provided as a continuous voltage on the unselected access lines.

14. The method of claim 10, wherein the third voltage is greater than both the first voltage and the second voltage.

15. The method of claim 1, wherein the memory cells comprise NAND memory cells.

16. The method of claim 15, wherein the memory cells comprise charge trap memory cells.

17. The method of claim 15, wherein the memory cells comprise floating gate memory cells.

18. The method of claim 15, wherein the memory cells comprise multilevel (MLC) NAND memory cells.

19. A memory device, comprising:
a memory array comprising,
a block comprising,
multiple strings of NAND memory cells in at least first and second sub-blocks, the multiple strings of NAND memory cells extending between a source and an associated data line of multiple data lines, each string including, multiple NAND memory cells,
a source select gate between the multiple NAND memory cells and the source,
a drain select gate between the NAND memory cells and the associated data line, and
channel material forming a pillar of the NAND memory cell string; and
multiple access lines coupled to respective memory cells in both of the first and second sub-blocks;
a memory device controller, comprising control circuitry configured to perform operations comprising performing a programming operation on a selected memory cell in a selected string of a selected sub-block of the first and second sub-blocks, the programming operation comprising a first portion and a second portion,
wherein the first portion of the programming operation comprises pre-charging the channel material of multiple strings of memory cells in both the selected sub-block and the unselected sub-block with a first voltage; and
wherein the second portion of the programming operation comprises,
after precharging the channel material of the strings of memory cells in the selected sub-block and the unselected sub-block, applying a programming voltage to a first access line coupled to the selected memory cell in the selected sub-block of the block of memory cells and to at least one unselected memory cell in the unselected sub-block, and
allowing the channel material of unselected strings in the unselected sub-block to charge to a second voltage greater than the first voltage in response to a coupled voltage induced on the channel material in the unselected sub-block by the programming voltage on the first access line.

20. The memory device of claim 19, wherein allowing the channel material of unselected strings in the unselected sub-block to charge to the second voltage comprises allowing the channel material of the strings of memory cells in the unselected sub-block to float.

21. The memory device of claim 20, wherein allowing the channel material of unselected strings of memory cells in the unselected sub-block to float comprises placing respective first select gates of the unselected strings of memory cells in a non-conducting state.

22. The memory device of claim 19, wherein the first portion of the programming operation further comprises applying a first SGD voltage to a data line associated with the selected string including the selected memory cell, and applying a second SGD voltage to other data lines associated with strings of memory cells in the selected and unselected blocks.

23. The memory device of claim 22, wherein the first portion of the programming operation comprises applying a third voltage to the selected access line and to multiple unselected access lines to establish a conducting condition in channels of the memory cells coupled to the access lines.

24. The memory device of claim 19, wherein the NAND memory cells are charge trap memory cells, and wherein the NAND memory cells comprise multilevel (MLC) memory cells.

* * * * *